United States Patent [19]

Rich et al.

[11] Patent Number: 4,860,012
[45] Date of Patent: Aug. 22, 1989

[54] INTEGRATED ANALOG-TO-DIGITAL CONVERTER

[75] Inventors: David Rich, Woodmere; Peter Staley, Kings Park, both of N.Y.

[73] Assignee: Microchip Technology Incorporated, Chandler, Ariz.

[21] Appl. No.: 65,263

[22] Filed: Jun. 22, 1987

Related U.S. Application Data

[62] Division of Ser. No. 829,624, Feb. 14, 1986.

[51] Int. Cl.⁴ ............................................. H03M 3/02
[52] U.S. Cl. ................................... 341/143; 341/110; 341/158; 341/126
[58] Field of Search ........................ 341/126, 143, 158

[56] References Cited

U.S. PATENT DOCUMENTS 4,017,849  4/1977  Tewksbury .......................... 341/143
4,107,669  8/1978  Tewksbury .......................... 341/143
4,353,060  10/1982 Endoh et al. ........................ 341/110
4,616,349  10/1986 Shirley ................................ 341/158

Primary Examiner—William M. Shoop, Jr.
Assistant Examiner—Helen Kim
Attorney, Agent, or Firm—James & Franklin

[57] ABSTRACT

A feedback coder, which employs simple CMOS push-/pull amplifiers as gain elements, along with a bistable circuit, in its preferred embodiment takes the form of a second-order delta-sigma modulator. The output of the modulator is converted into pulse code modulated words by a finite impulse response filter which incorporates a partial coefficient generator utilizing simplified logic. The generator output is provided to an accumulator in which the stages operate at reduced speed. A simple multiplexer generates a serial output. The entire converter can be integrated on a semiconductor chip of relatively small area.

33 Claims, 17 Drawing Sheets

N-BIT FEEDBACK CODER

N-BIT FEEDBACK CODER

SINGLE BIT FEEDBACK CODER

SECOND ORDER SINGLE BIT FEEDBACK CODER

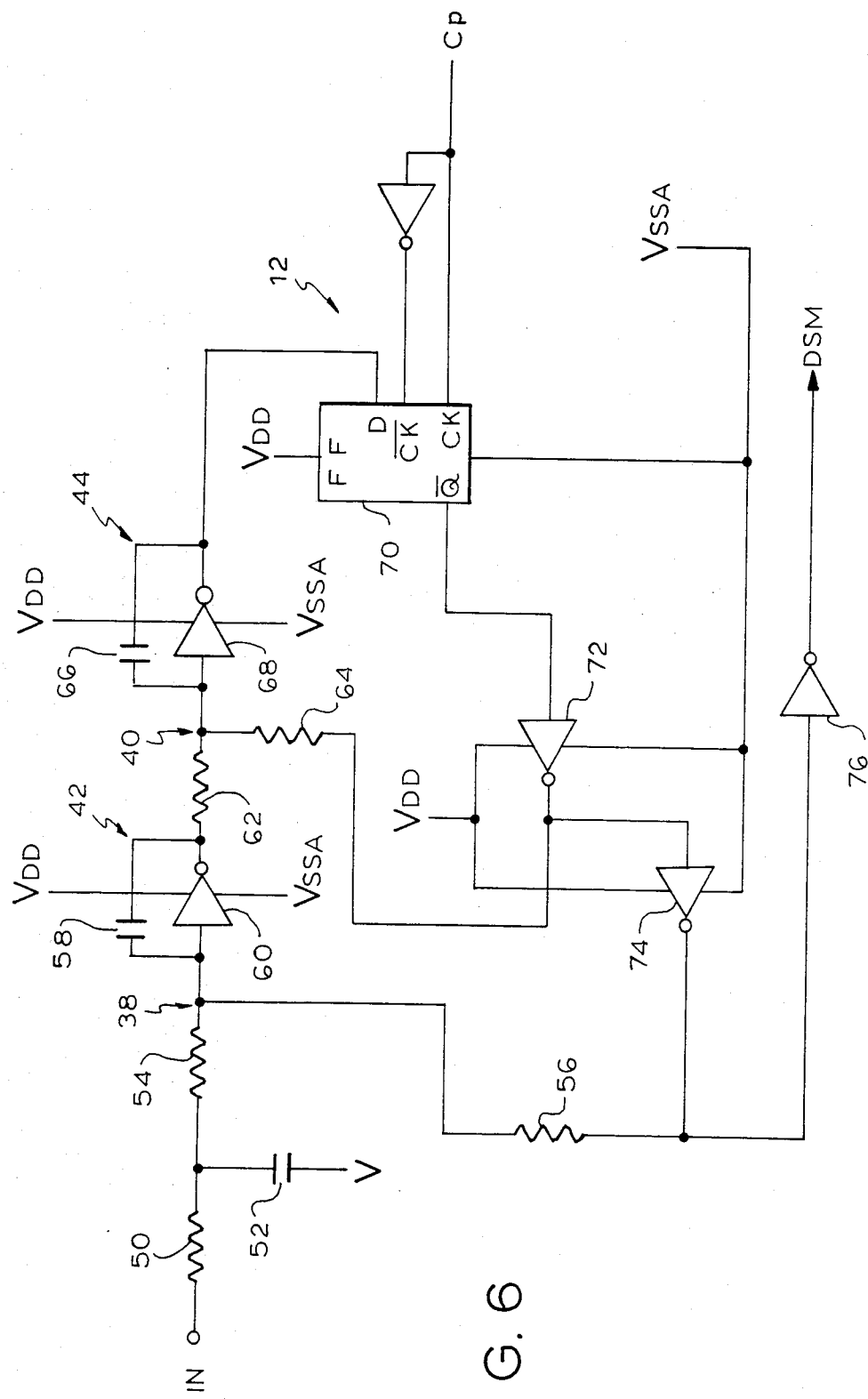
F I G. 6

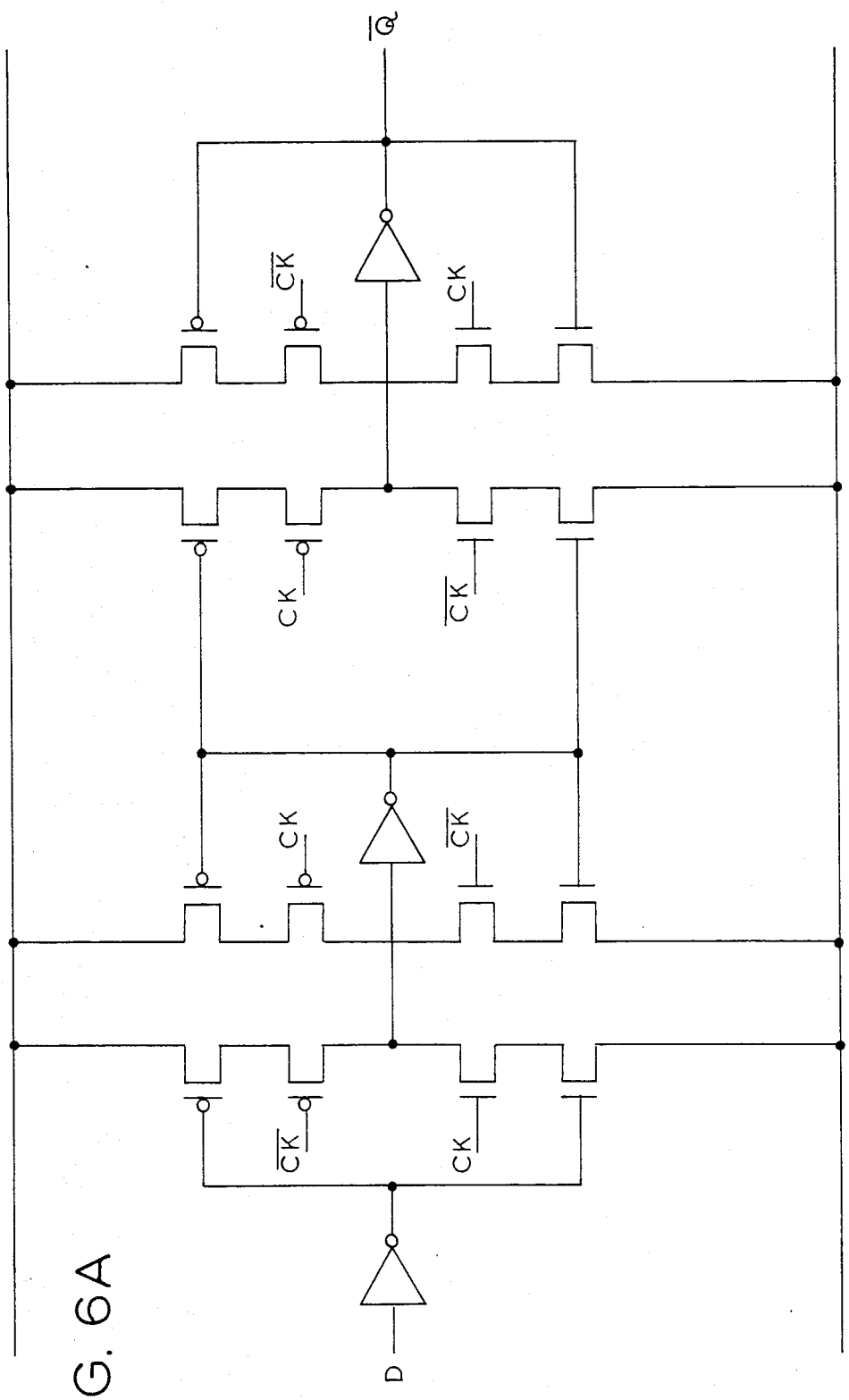
F I G. 6A

FIR FILTER    SUBSAMPLER

SPECIAL CASE FIR FILTER

F I G. 11
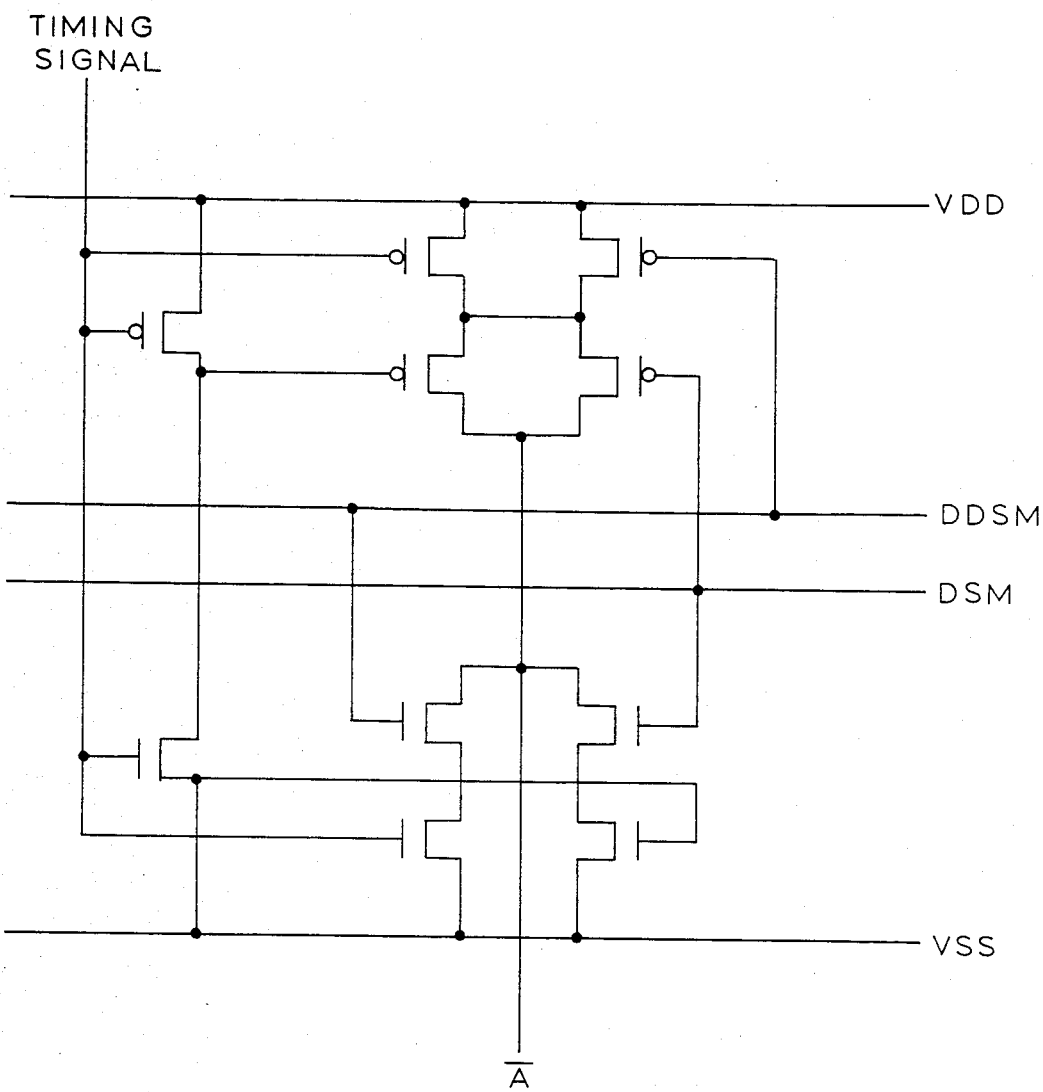

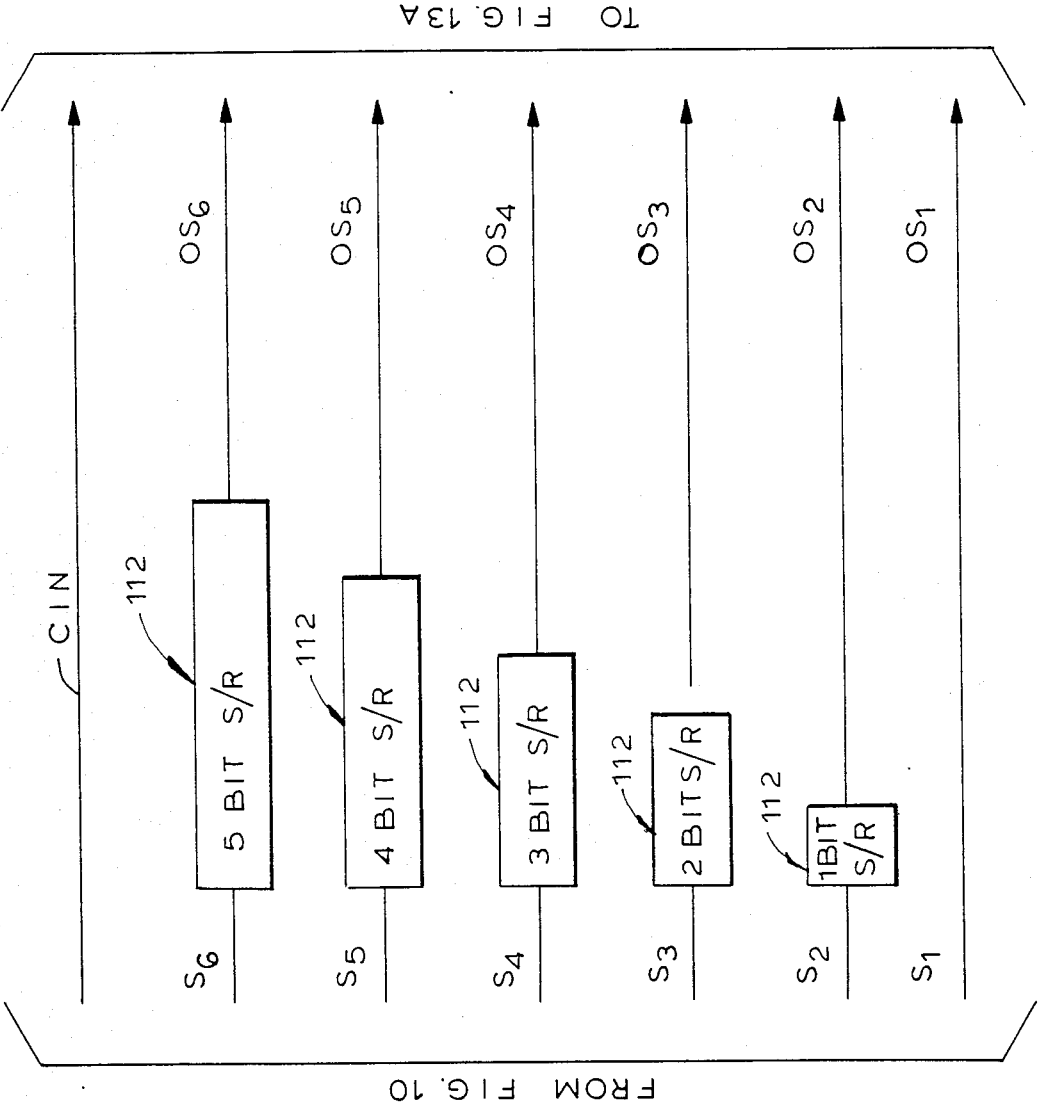

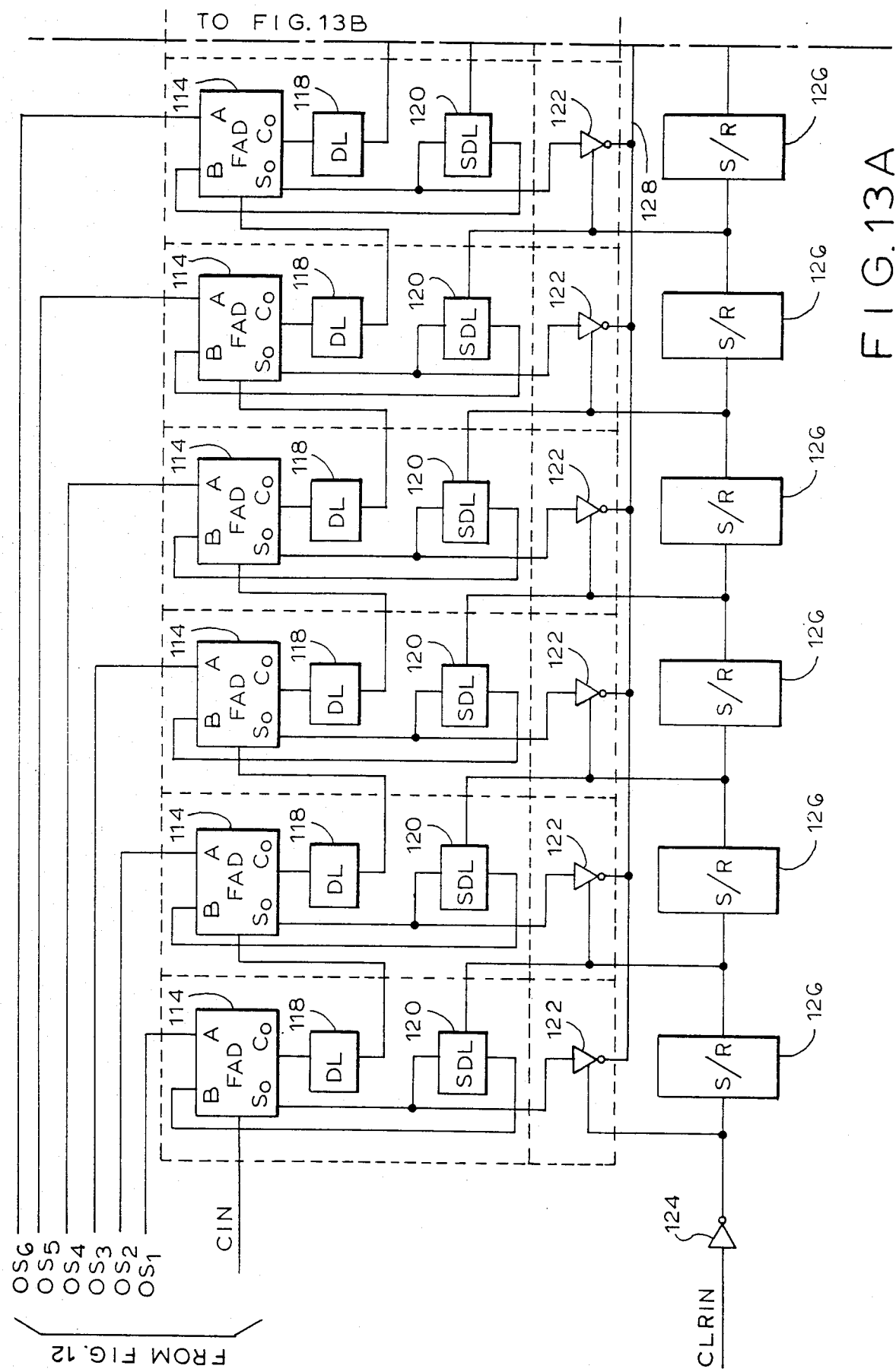

F I G. 18
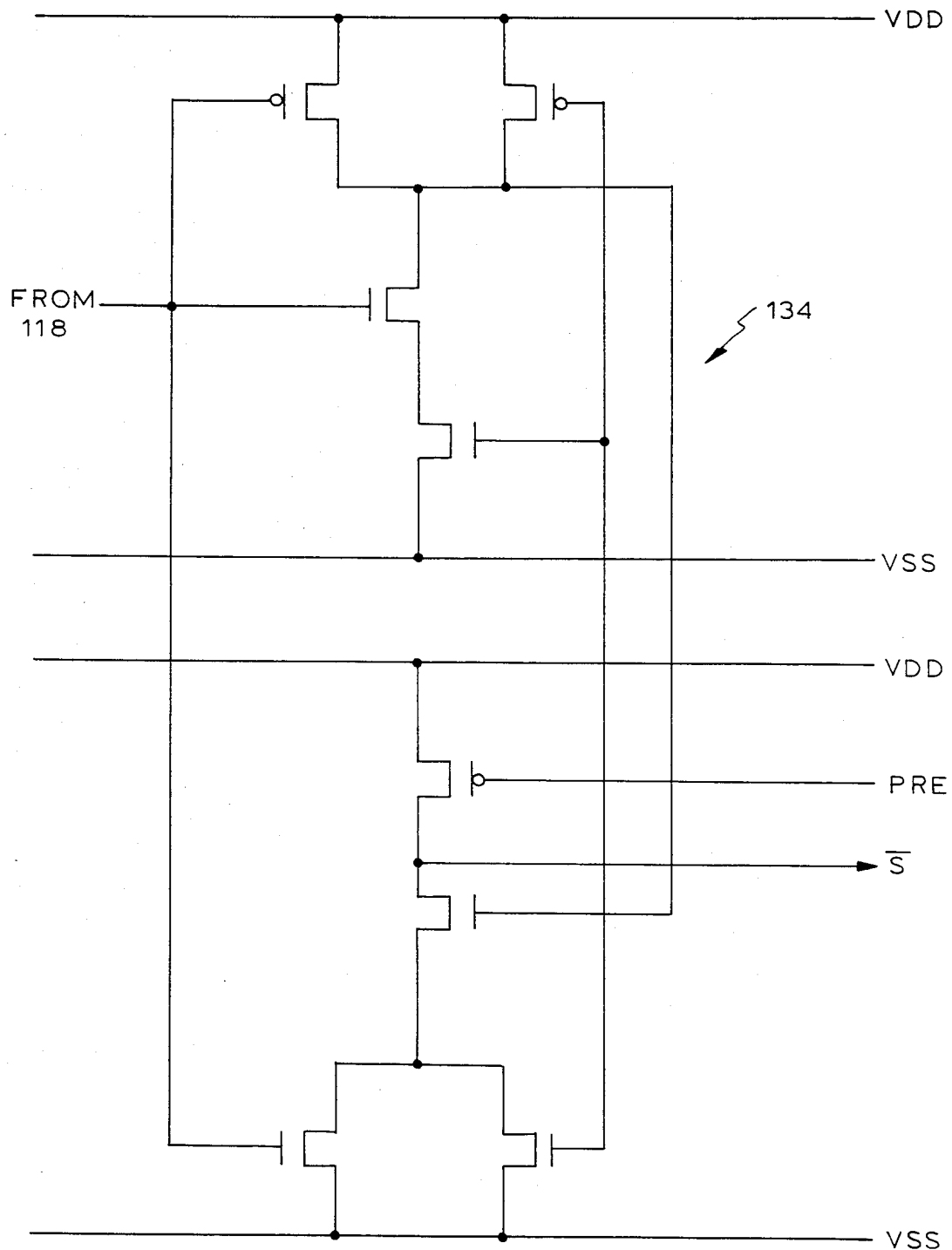

INTEGRATED ANALOG-TO-DIGITAL CONVERTER

This is a divisional of co-pending application Ser. No. 829,624 filed on Feb. 14, 1986.

The present invention relates to analog-to-digital converters and, more particularly, to a specialized form of analog-to-digital converter which exhibits reduced process sensitivity and which is capable of being integrated on a semiconductor chip of relatively small area.

Circuits which convert analog signals to digital equivalents have been known and used for years in various applications. One such application, which has recently become prominent, is as a portion of a digital modem.

A modem is an electronic device which functions as an interface to permit digital equipment, such as computers, to communicate with each other over standard telephone lines. In a modem, the digital output of a computer or the like is translated into an analog signal which can be propagated through the telephone system. Analog signals generated by another modem on the other end of the communication link are converted into digital signals.

Conventional modems include certain components, particularly filters, which are basically analog in nature. Such components cannot be fabricated easily in integrated circuits and are therefore costly to manufacture and require relatively large amounts of space. The analog functions can be performed by digital signal processing (DSP) blocks to yield higher performance and reduced manufacturing costs. To use DSP techniques requires that the analog signals be converted to digital signals.

The present invention is an analog-to-digital converter which can be integrated on a semiconductor chip of relatively small size and which has reduced process sensitivity. The converter includes an integrated feedback coder which reduces the analog circuit part count and which employs gain stages of reduced process sensitivity. The output of the coder, which is a delta sigma modulated data stream, is converted to a pulse code modulated stream in a finite impulse response filter which employs a simplified logic system. The simplification of the logic occurs by observing that the data output of the filter is not required at the input stream rate in the accumulator portion which generates the serial digital output.

The logic system for the filter may be further simplified by designing for the special case of a triangular window. The pulse code modulated output stream is made available at a rate equal to the pulse code modulated input stream rate divided by half the number of taps of the windowing filter.

A simplified accumulator portion is utilized for combining the partial coefficients generated from the above logic at the pulse code modulated word rate. The accumulator and shift register logic functions are combined into a single block in which the adder circuits are operated at reduced speeds.

It is, therefore, a prime object of the present invention to provide an analog-to-digital converter which can be integrated on a semiconductor chip of reduced area.

It is another object of the present invention to provide an integrated analog-to-digital converter which employs a feedback coder with reduced process sensitivity and reduced size.

It is another object of the present invention to provide an integrated analog-to-digital converter which employs a feedback coder utilizing simplified gain stages.

It is another object of the present invention to provide an integrated analog-to-digital converter which employs a decimator filter with a simplified logic system.

It is another object of the present invention to provide an integrated analog-to-digital converter wherein accumulator and shift register logic blocks are combined.

It is another object of the present invention to provide an integrated analog-to-digital converter wherein the stages in the accumulator operate at reduced speed.

In accordance with one aspect of the present invention, a feedback coder is provided. The coder comprises a summation circuit having first and second inputs and an output. The first input receives the analog signal to be coded. The output of the summation circuit forms the input to a first filter means. The output of the first filter means forms the input to an analog-to-digital circuit, the output of which forms the output of the coder and is operably connected to the input of a second filter means. The output of the second filter means forms the second input to the summation circuit. Each of the first and second filter means comprises a push/pull CMOS amplifier.

The coder further comprises a digital-to-analog circuit operably connected between the output of the analog-to-digital circuit and the input to the second filter means. Preferably, an adaptive step size circuit is operably connected to the digital-to-analog circuit.

The analog-to-digital circuit may be simplified to comprise a comparator and a latch and may be further simplified to comprise a clocked bistable circuit, such as a D-type flip-flop.

The coder further comprises a second summation circuit having first and second inputs and an output. The first input is connected to the output of the first filter means. The second input is connected to the output of the analog-to-digital circuit. The output of said second summation circuit is connected to the input of the analog-to-digital circuit.

In its simplified form, the digital-to-analog circuit comprises a clocked switch means. The switch means is connected between positive and negative reference voltage sources.

In accordance with another aspect of the present invention, a feedback coder is provided including first and second summation means, each having first and second inputs and an output. The first input of said first summation means receives an analog signal to be coded. First filter means are provided which are operably connected between the output of the first summation means and said first input of said second summation means. Second filter means, a digital-to-analog circuit, and an analog-to-digital circuit are provided. The second filter means is operably connected between the output of the second summation means and the analog-to-digital circuit. The analog-to-digital circuit is operably connected between the second filter means and the input of the digital-to-analog circuit. The output of the digital-to-analog circuit is connected to the first and second summation means. Each of the first and second filter means comprises CMOS push/pull amplification means. The output of the analog-to-digital circuit forms the coder output.

In accordance with another aspect of the present invention, a feedback coder is provided. The coder comprises first and second summation means, each having first and second inputs and an output, first and second filter means and bistable means. The first input of the first summation means is connected to receive the analog input to the coder. The input of the first filter means is connected to the output of the first summation means. The first input of the second summation means is connected to the output of the first filter means. The input of the second filter means is connected to the output of the second summation means. The input of the bistable means is connected to the output of the second filter means.

The output of said bistable means is operably connected to the second input of each summation means and the coder output.

First inverter means is operably connected between the output of the bistable means and the second input of the first summation means. Second inverter means may be operably connected between the first inverter means and the coder output. In some cases, a third inverter means is preferably connected between the bistable output and the second input of the second summation means.

The summation means and the connected filter means in the coder are combined into a single circuit which comprises a basic CMOS push/pull amplifier, a feedback capacitor and two resistors. The bistable means preferably comprises a D-type flip-flop circuit.

In accordance with another aspect of the present invention, a finite impulse response (FIR) filter is provided. The filter comprises a partial coefficient generator and an accumulator. The generator comprises memory means having input means and output means. Counter means and a plurality of series connected shift register means are provided. The filter input and the output of each shift register means, along with the output of the counter means, are connected to the input means of the memory means. The input of the accumulator is operably connected to the output of the memory means. The output of the accumulator forms the output of the filter.

The memory means preferably comprises a read only memory, the input means being the address inputs to the memory. The counter means preferably comprises a binary counter. The counter may be, for example, a 6-bit counter. The shift register means may, for example, comprise three 64-bit registers.

In accordance with another aspect of the present invention, a specialized form of finite impulse response filter is provided, including a partial coefficient generator and an accumulator. The partial coefficient generator comprises means for receiving the input signal to be filtered, means for delaying the input signal, and circuitry which provides the function of a counter, including a plurality of selector logic means and means for generating a plurality of ordered timing pulse trains. Each of the pulse trains has a frequency which is a given fraction of the frequency of the prior timing signal, in order. Each of the logic means receives a different one of the pulse trains, the input and the delayed input signal, and generates one bit of a parallel output word.

Each logic means comprises means for forming an output to be at the same state as the state of the received pulse train if the input signal is in a high state, to be the complement of the state of the received pulse train if the delayed input signal is in a high state, to be a high state if both the input signal and the delayed input signal are in a high state, and to be a low state if both the input signal and the delayed input signal are in the low state.

In accordance with another aspect of the present invention, finite impulse response (FIR) means is provided. The filter means comprises means for receiving the input to be filtered, means for delaying the input and logic means for receiving the input, the delayed input, and the timing signals and forming the bits of a parallel output word therefrom.

A timing signal generator is provided, comprising means for generating a plurality of ordered timing pulse trains. Each pulse train has a frequency which is a given fraction of the frequency of the prior pulse train in order. The filter means comprises a plurality of stages. Each stage comprises selector logic means. Each of the selector logic means receives the coder output, the delayed coder output, and the different one of the pulse trains and generates one bit of a parallel output word.

In accordance with another aspect of the present invention, an accumulator is provided. The accumulator means includes means for delaying each bit of a multi-bit input word by an interval which is a function of the position of the bit in the word. A plurality of stages are provided, each of the stages comprising adder means. Each of the adder means has first and second data inputs, a clock input, a sum output, and a carry output. The first data input of each of the adder means receives a different bit of the delaying means output. Means are provided for connecting the second data input of each adder means with the sum output thereof. Means are provided for connecting the clock input of each adder means to the carry output of the preceding adder means.

The means for connecting the second data input of each adder means to the sum output thereof preferably comprises sum output delay means. The means for connecting the clock input of each adder means to the carry output of the adder means fo the preceding stage preferably comprises carry output delay means.

The accumulator has a given number of stages and further comprises a multiplexer including a given number of shift register stages respectively corresponding with the accumulator stages and connected in tandem. Each of the shift register stages has an output. Each of the outputs is operably connected to the set input of the sum output delay means of the corresponding accumulator stage. The multiplexer further comprises means for inverting the output of the last shift register stage.

To these and to such other objects which may hereinafter appear, the present invention relates to an integrated analog-to-digital converter, as set forth in detail in the following specification and as recited in the annexed claims, taken together with the accompanying drawings, wherein like numerals refer to like parts, and in which:

FIG. 6 is a schematic diagram of the delta sigma modulator of the present invention;

FIG. 6A is a schematic diagram of the static D-type flip-flop circuit employed in the single bit feedback coder illustrated in FIG. 6;

FIG. 11 is a schematic diagram of a typical selector logic block from FIG. 10;

FIG. 12 is a schematic diagram of the preferred embodiment of the initial section of the accumulator of the FIR filter of the present invention;

FIGS. 13A and 13B are block diagrams of the preferred embodiment of the remaining section of the accumulator of the present invention;

FIG. 18 is a schematic diagram of the DAD cell of the present invention;

Figure 1:
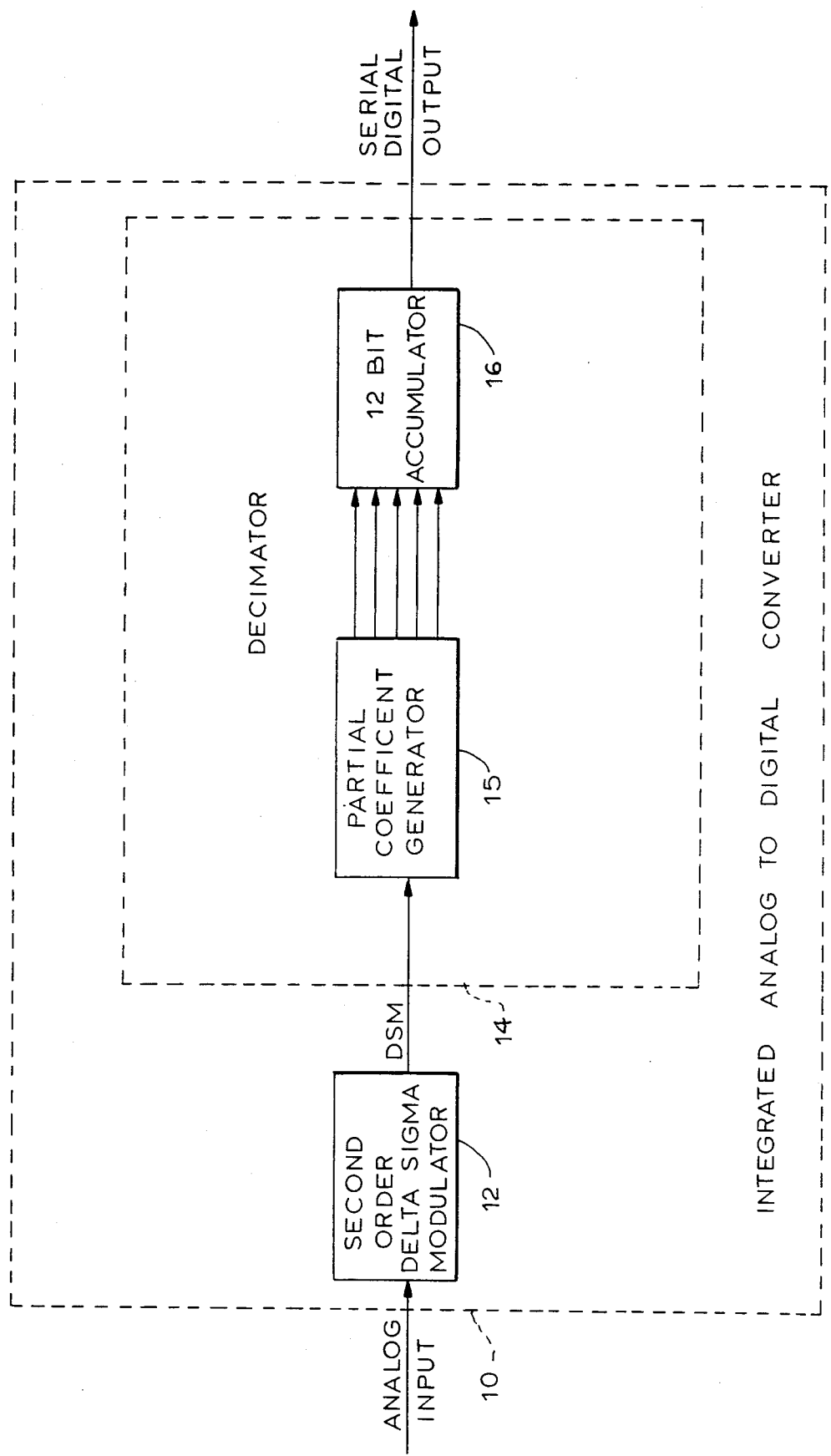
FIG. 1 is a block diagram of the integrated analog-to-digital converter of the present invention.

In general, as depicted in FIG. 1 in block diagram form, the present invention is an integrated analog-to-digital converter, generally designated 10. The converter comprises a feedback coder and a decimator, each of which is itself novel. The unique feedback coder of the present invention could be used to drive a conventional decimator. Alternatively, a conventional feedback coder could be used to provide the input to the unique decimator of the present invention. However, using these novel components together provides optimum results and the are described together for that reason.

In its most preferred embodiment, the feedback coder takes the form of a single bit, second order delta sigma modulator 12 in which the filter elements are conventional CMOS push/pull amplifiers, as explained below. Modulator 12 receives the analog signal to be digitized at its input and generates a delta sigma stream (DSM) of unweighted bits representative of the amplitude of the received analog signal.

The output of modulator 12 forms the input to a decimator 14 which includes a partial coefficient generator 15 and a data accumulator 16. Generator 15 and accumulator 16 function as a finite impulse response filter and a subsampler. In its most preferred form, the finite impulse response filter has a triangular response. Generator 15 generates parallel partial coefficient words to accumulator 16. Accumulator 16 includes a simple multiplex circuit. The serial digital output of accumulator 16 provides the output of the converter. The output of the accumulator is a serial pulse code modulated word.

As will become apparent, the configuration of modulator 12, generator 15, and accumulator 16 of the present invention has been simplified, as explained in detail below, in order to eliminate the necessity for discrete components and to permit the entire converter to be fabricated on an integrated semiconductor chip of relatively small size.

Figure 2:
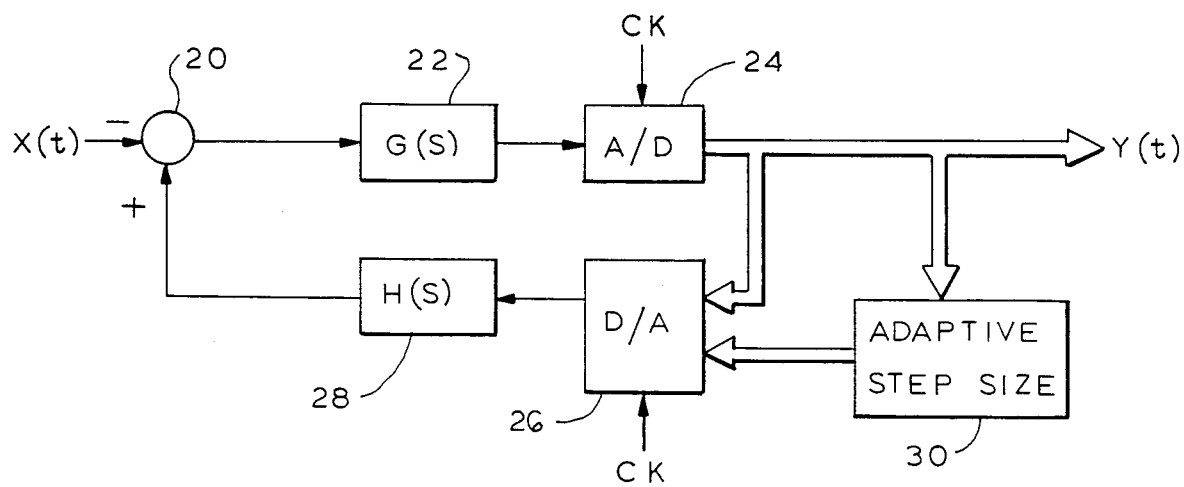
FIG. 2 is a block diagram of the N-bit feedback coder of the present invention.

The feedback coder of the present invention is represented in block diagram form in FIG. 2, in its most generalized form. The coder is illustrated as a generalized N-bit feedback coder, although the preferred embodiment described in detail below is a single bit feedback coder. The analog input signal X(t) forms the input to a summation circuit 20, the output of which is connected to a first filter G(S) 22. The output of filter 22 forms the input to an analog-to-digital circuit 24, the output of which forms the coder output Y(t), and the input to a feedback loop which includes a digital-to-analog circuit 26 and a second filter H(S) 28. The output of filter 28 forms the second input to summation circuit 20. A conventional circuit 30 is connected between the output of analog-to-digital circuit 24 and the control input of digital-to-analog circuit 26 to adapt digital-to-analog circuit 26 to the required step size.

Filters 22 and 28 shape the quantization noise spectra at the output Y(t) so as to move the dominant part of this spectra past twice the maximum input frequency X(t). The quantization noise can then be rejected by further filtering of Y(t) without affecting the encoded information signal X(t). If the transfer function of X(t) to Y(t) is not flat in the pass band, then inverse filtering of Y(t) is required to restore the signal.

Filters of this type are formed using passive or active (op-amp) components. The performance requirements for the active components are difficult to meet because of the high sampling rate of the system. In the prior art, these filters have been formed with only passive components or by switched capacitor circuits in MOS designs. However, forming the filters with only passive components restricts the possible functions which can be realized for these filters. On the other hand, using MOS switched capacitor circuits results in large process sensitive filters where the upper frequency limit of the sampling frequency is restricted. Further, the sampled data operation of the switched capacitor filters can degrade the performance of the system.

Figure 3:
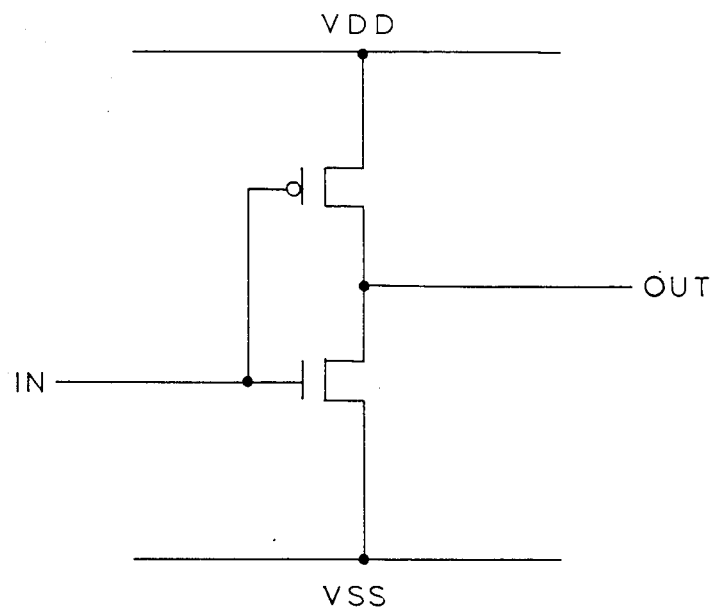
FIG. 3 is a schematic diagram of the CMOS push/pull amplifier used as a gain element in the feedback coder of the present invention.

The present invention overcomes the above disadvantages by substituting integrators including simple amplifier circuits as gain elements for these filters. FIG. 3 is a schematic diagram of a basic CMOS push/pull amplifier which, when used in conjunction with a feedback capacitor and the appropriate resistors, forms the filters in the coder of the present invention.

The circuit disclosed in FIG. 3 is a simple inverter, when used in the digital section of the system. It may be used as an active gain stage provided differential amplification is not required and the circuit can operate with large random and systematic DC offset voltages.

Differential amplifications is not a problem in the feedback coders of the present invention which requires only single ended gain stages in the filters. The DC offset voltages have no deleterious effect provided that the DC transfer response to a DC error signal in the forward path is zero and the feedback filter 28 is realized with passive elements.

The circuit of FIG. 3 has a single dominant pole determined by loading at the output and the drain-to-source conductance (GDS) of the transistors. The gain is determined by the transconductance of the transistors and the drain-to-source conductance. Thus, the gain bandwidth can be made very high. The slew rate of the circuit is determined by the large signal current capacity of the transistors and can be made very large by using large device sizes.

Accordingly, the performance of the amplifying stage shown in FIG. 3 is well suited for the requirements of the feedback coder filter block. The amplifier allows improved performance of the generalized feedback coder when compared to specifications achievable by large MOS operational amplifiers.

The standard MOS process provides means of realizing passive resistors and capacitors. These elements are required in addition to the amplifers shown in FIG. 3 for implementing the filter blocks for the feedback coder.

A problem with the passive components in MOS systems is the large component tolerance variation. This causes the variation in absolute pole-zero position of the feedback coder filters to be large. This variation, however, has only a small effect on the feedback coder performance.

Figure 4:
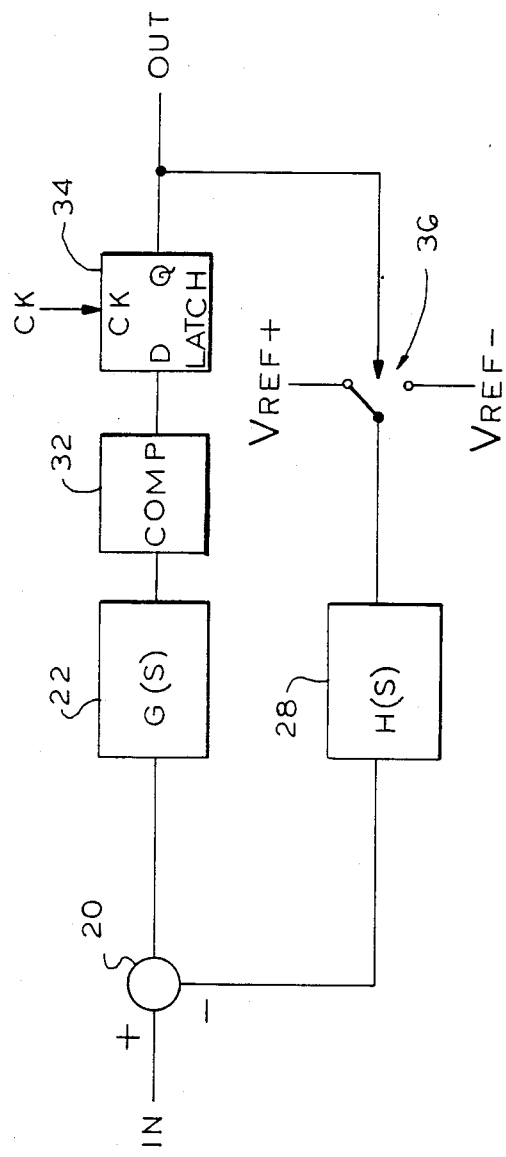
FIG. 4 is a block diagram of a preferred embodiment of the single bit feedback coder of the present invention.

A single bit feedback coder can be formed from the generalized N-bit coder of FIG. 2 by replacing analog-to-digital circuit 24 with a comparator 32 and a clocked latch 34, as shown in FIG. 4. In addition, the ditigal-to-analog circuit 26 can be replaced by a simple two position switch 36, clocked by the output of the coder.

Further simplification is possible by eliminating switch 36, such that the output of the latch is used to directly drive filter 28. This is achieved by designing the loop gain of the system to operate with reference voltages of $V_{DD}$ and $V_{SS}$ respectively.

Figure 5:
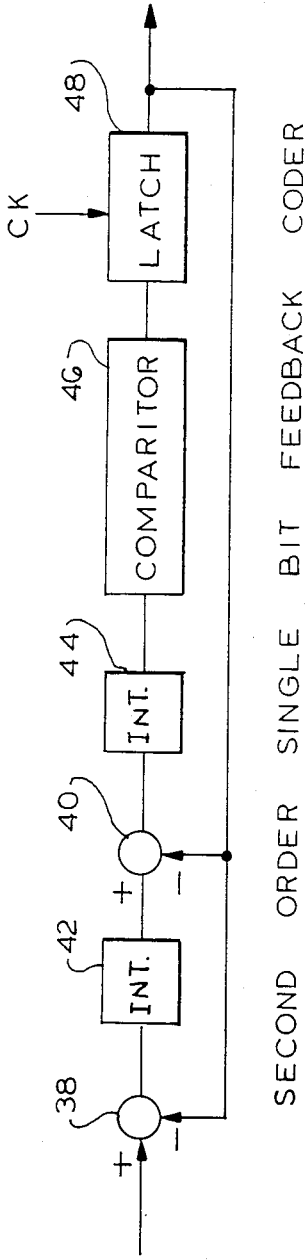
FIG. 5 is a block diagram of a preferred embodiment of the second order single bit feedback coder of the present invention.

A block diagram of a second-order single bit feedback coder which has a closed loop pass band transfer function of unity (also known as a second-order delta-sigma modulator) is illustrated in FIG. 5. It consists of first and second summation circuits 38, 40, a first filter 42, a second filter 44, a comparator 46, and a clocked latch 48. Each filter comprises a first order low pass filter, preferably in the form of a single order integrator, most preferably in the form of the CMOS push/pull amplifier circuit described above. The output of latch 48 forms an input for each of the summation circuits 38 and 40.

The details of the second-order delta-sigma modulator 12 of the present invention are illustrated in the schematic diagram of FIG. 6. In this circuit, further simplification is achieved by eliminating the comparator and performing the comparator function directly in a conventional static D-type flip-flop implemented in CMOS, as illustrated in FIG. 6A. The analog input signal is received at resistor 50 which, along with capacitor 52, form a single pole filter to remove all signal components above half the sampling rate of the delta sigma modulator. Resistors 54, 56, capacitor 58, and active gain element 60 (which takes the form of the amplifier illustrated in FIG. 3) form the first summer 38 and filter 42. The second summer 40 and the second filter 44 are formed in a similar manner using resistor 62, resistor 64, capacitor 66, and amplifier 68 (of the type shown in FIG. 3).

D-type flip-flop circuit 70 illustrated in FIG. 6A and inverter 72 replace comparator 46 of FIG. 5. The data input D of flip-flop 70 is connected to the output of amplifier 68. The clock inputs CK and $\overline{CK}$ of the flip-flop are fed with a timing pulse $C_p$ (which may be, for example, 2 MHz) from a baud rate generator (not shown) and the complement thereof. The $\overline{Q}$ output of flip-flop 70 forms the input to an inverter 72. (If a Q output is available, inverter 72 is not required.) The output of inverter 72 (or the Q output of the flip-flop 70, if available) is applied to the second summer 40 through resistor 64 and to the input of an inverter 74. The output of inverter 74 forms the input to the first summer 38 through resistor 56 and the input to an inverter 76. The output of inverter 76 is the output of the delta-sigma modulator, designated DSM. Inverter 76 may also be eliminated if the output of the modulator is taken from the output of inverter 72 (or directly from the Q output of flip-flop 70, if available).

The DSM output of the delta-sigma modulator is converted into a pulse code modulated (PCM) word by filtering it with a finite impulse response (FIR) filter and sub-sampling the output of the FIR filter at the PCM word rate. The combination of these functions is often called a decimator.

The number of filter sections and the value of the taps determine the response of the FIR filter. The filtering of the signal, in addition to forming the PCM data word, provides the anti-alias filtering to allow the output of the filter to be sub-sampled to provide a PCM data stream at a much lower rate than the delta sigma modulator sampling rate. The combinatinon of FIR filtering and sub-sampling provide significant reduction in hardware requirements over the realization of the two block separation. A conceptual full hardware realization is illustrated in block form in FIG. 7.

Figure 8:
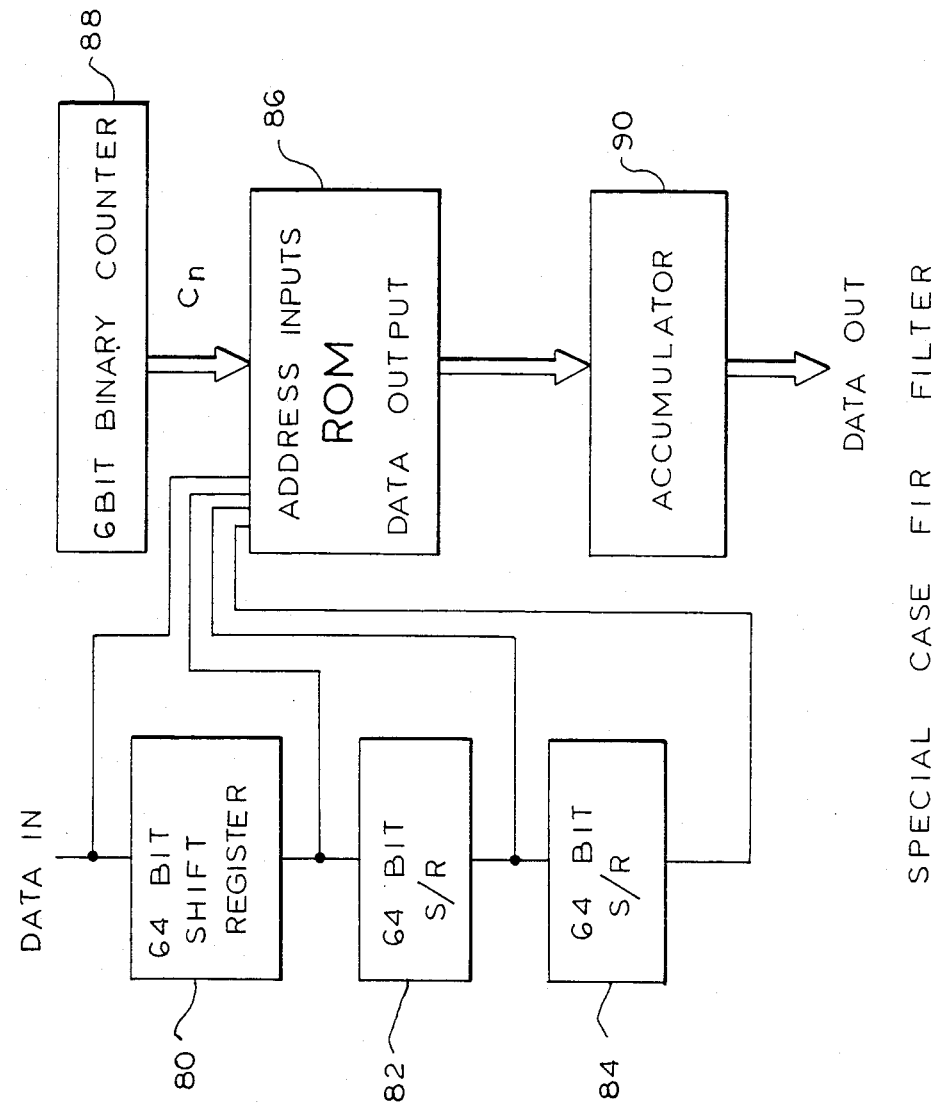
FIG. 8 is a block diagram of a preferred embodiment of a finite impulse response filter of the present invention.

Hardware reduction is possible when it is observed that the data output from the FIR filter is only required at the sub-sampling interval. An example of how this hardware reduction can be achieved is set forth in block diagram form in FIG. 8. As seen in FIG. 8, the data input is applied to the input of the first of three tandem connected 64-bit shift registers 80, 82, 84 and to the address inputs of a read only memory 86. The outputs of each of the registers are also applied to the address inputs of the ROM, along with the output of a 6-bit binary counter 88. The data output of the ROM is connected to the input of an accumulator 90 which generates the data output.

In this implementation, sub-sampling takes place at a rate equal to one-sixty-fourth of the input rate and the FIR filter is 256 taps long. However, the structure allows any number of FIR filter tap positions. Tap size is altered by changing the size of the binary counter and the ROM size. The sub-sampling rate can also be adjusted by changing the number of shift register blocks used to delay the DSM data and changing the ROM size.

The simpler case of sub-sampling at the tap rates can be considered for a 64 tap decimator. A 6-bit binary counter 88 addresses ROM 86. The data address is the 7th bit of the ROM. If no data is present at the input, no data is added to the accumulator. If data is present, then the filter binary coefficient $a_n$ is down loaded from the ROM if the binary counter input to the ROM is $c_n$. The data in ROM 86 is representative of the data for one of (in this case) 64 tap positions in the FIR filter. Hence, after 64 clock cycles, 64 data input points will have cycled through all 64 filter coefficients. After 64 clock cycles, the accumulator is dumped and cleared.

Figure 7:
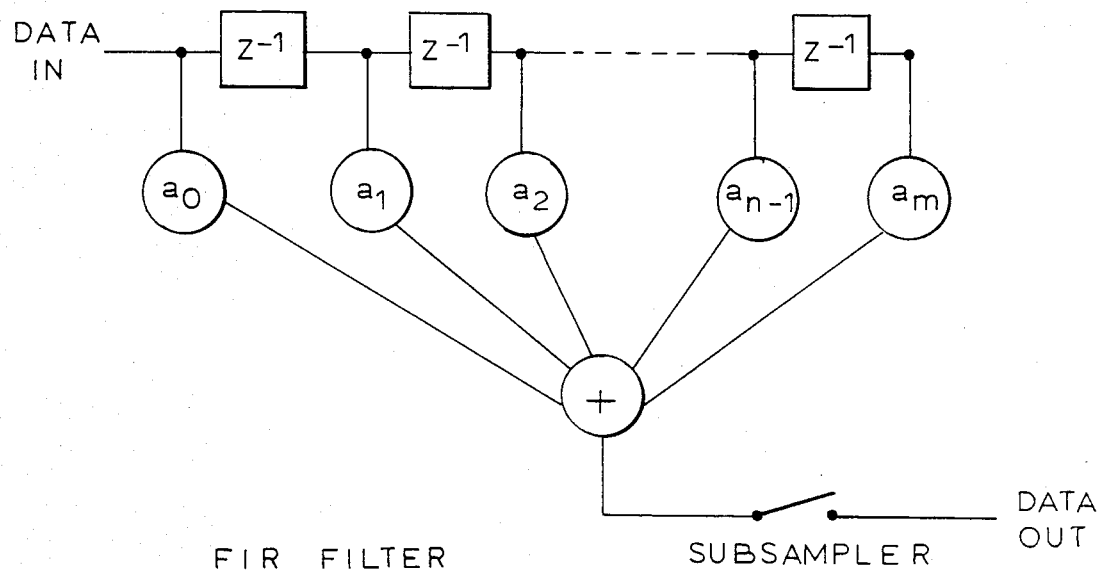
FIG. 7 is a block diagram of a generalized decimator including finite impulse response filter and sub-sampler.

The data dumped from the accumulator is equal to the data at the output of the FIR filter in FIG. 7 at the sampling instant (the sampling occurs when the switch is closed). Note that the data at the output of the FIR filter in FIG. 7 is not used when the sampling switch is open. In effect, we have a serial implementation of the FIR filter and sampler shown in FIG. 7. Hence, the implementation illustrated in FIG. 8 is equivalent to the FIG. 7 implementation with significant reduction in hardware complexity.

Now consider the case of a sample every 64 data input cycles and a FIR filter of 256 taps long. In this implementation, the 256 coefficients of the FIR filter must be accumulated in 64 clock periods. This can be achieved by expanding ROM 86 to contain the coefficient data groups containing 16 possible outputs for every clock cycle. The 16 possible outputs represent the 16 combinations of four coefficients from the FIR filter, summed for the 16 possible data point combinations that appear at the ROM at a given binary counter period n. The contents of the ROM for the binary counter input $C_n$ are shown in the following table:

TABLE I

| Data | | | | |
|---|---|---|---|---|
| $C_{n+192}$ | $C_{n+128}$ | $C_{n+64}$ | $C_n$ | ROM Output |
| 0 | 0 | 0 | 0 | 0 |
| 0 | 0 | 0 | 1 | $a_n$ |
| 0 | 0 | 1 | 0 | $a_{n+64}$ |
| 0 | 0 | 1 | 1 | $a_n + a_{n+64}$ |
| 0 | 1 | 0 | 0 | $a_{n+128}$ |
| 0 | 1 | 0 | 1 | $a_n + a_{n+128}$ |
| 0 | 1 | 1 | 0 | $a_{n+64} + a_{n+128}$ |
| 0 | 1 | 1 | 1 | $a_n + a_{n+64} + a_{n+128}$ |
| 1 | 0 | 0 | 0 | $a_{n+192}$ |
| 1 | 0 | 0 | 1 | $a_n + a_{n+192}$ |
| 1 | 0 | 1 | 0 | $a_{n+64} + a_{n+192}$ |
| 1 | 0 | 1 | 1 | $a_n + a_{n+64} + a_{n+192}$ |
| 1 | 1 | 0 | 0 | $a_{n+128} + a_{n+192}$ |
| 1 | 1 | 0 | 1 | $a_n + a_{n+128} + a_{n+192}$ |
| 1 | 1 | 1 | 0 | $a_{n+64} + a_{n+128} + a_{n+192}$ |
| 1 | 1 | 1 | 1 | $a_n + a_{n+64} + a_{n+128} + a_{n+192}$ |

Using the approach outlined, all 256 positions will be multiplied by 256 data points in 64 time periods. In this implementation, each piece of DSM output data is sampled four times for four separate sampling periods. This method can be summarized as a serial-parallel implementation of the sampled FIR filter of FIG. 7. At each binary counter input to ROM 86, $c_n$, four parallel data points are examined and over the 64 clock cycles, all 256 taps positions are utilized.

Figure 9:
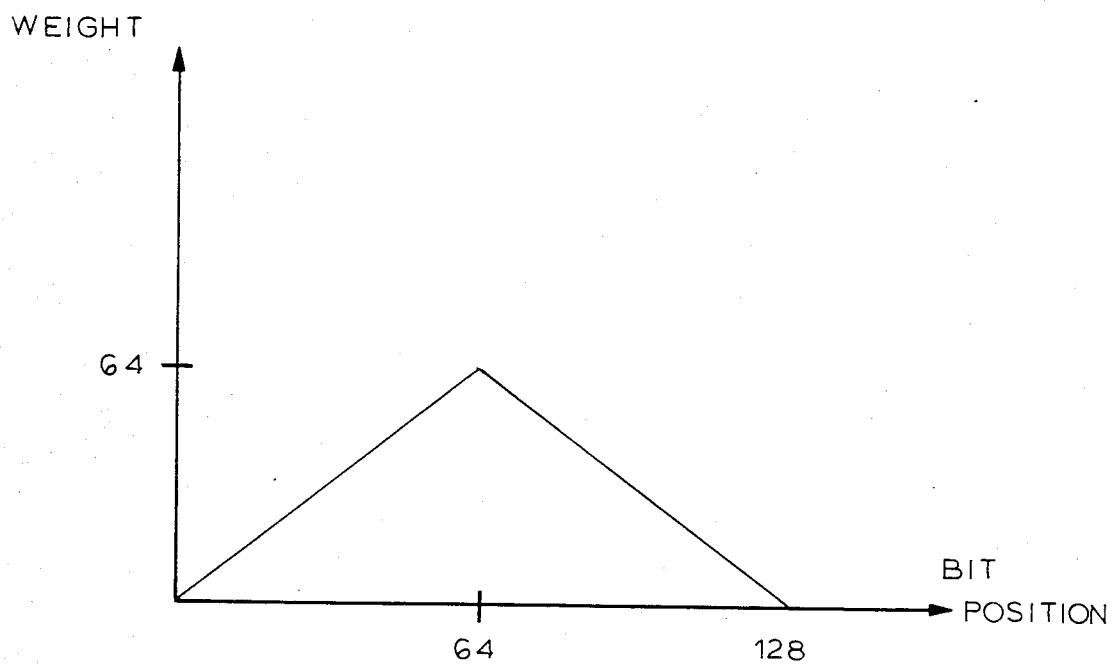
FIG. 9 is a graphical representation of the triangular response of the FIR filter of the present invention illustrated in FIG. 8.

For the special case of a decimator composed of a FIR filter with a triangular impulse response and a sub-sampling rate of half of the FIR filter length, the ROM 86 may be replaced by simple combinational logic. FIG. 9 is a graphical representation of the impulse response transfer function for a 128 tap filter. The sub-sampling rate is one-sixty-fourth of the input rate for the FIR filter of length 128.

The simplification achieved by eliminating ROM 86 can best be understood by examining the nature of the ROM code for the system described and noting that for the triangular impulse response $a_n = c_{n+1}$ and $a_{n+64} = 63 - c_n$. It is also noted that $63 - c_n = \overline{c_n}$, where $\overline{c_n}$ is the complement of each bit in $c_n$. It is therefore possible to implement the function shown in the following table with the combinational logic illustrated in FIGS. 10 and 11:

TABLE II

| $c_{n+64}$ | $c_n$ | ROM Output | Logical Equivalent |
|---|---|---|---|
| 0 | 0 | 0 | 0 |
| 0 | 1 | $a_n$ | $c_{n+1}$ |
| 1 | 0 | $a_{n+64}$ | $63 - c_n$ |
| 1 | 1 | $a_n + a_{n+64}$ | 1 |

Figure 10:
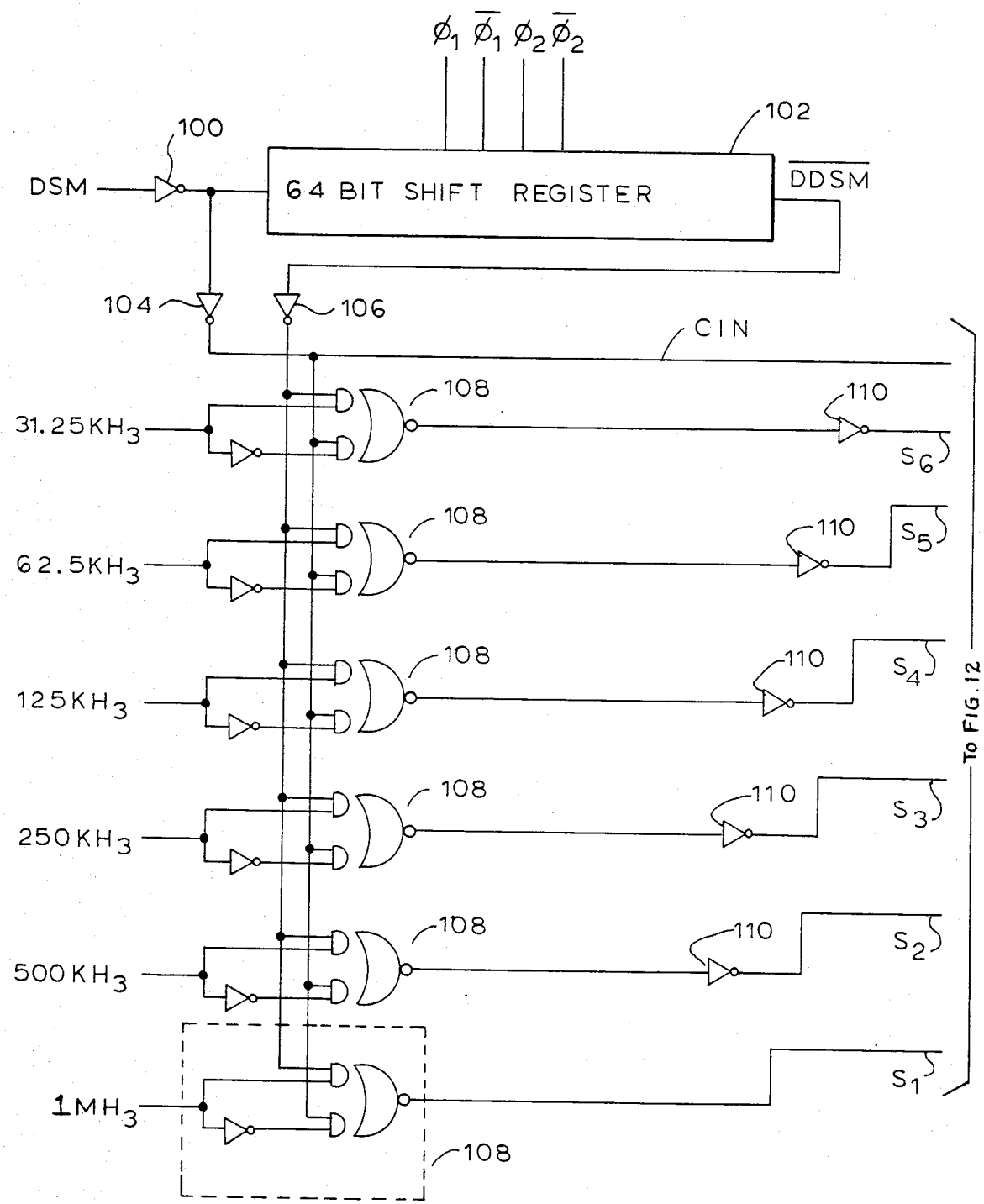
FIG. 10 is a schematic diagram of the preferred embodiment of the partial coefficient generator section of the FIR filter of the present invention.

Referring to FIG. 10, the DSM output from the delta-sigma modulator 12 is inverted by an inverter 100 and fed to the data input of a 64-bit shift register 102. Shift register 102 receives timing signals $\phi_1$, $\overline{\phi_1}$, $\phi_2$, and $\overline{\phi_2}$ from a timing generator (not shown) and generates at its output the delayed $\overline{DSM}$ signal, designated $\overline{DDSM}$. $\overline{DSM}$ and $\overline{DDSM}$ are each separately inverted by inverters 104 and 106. The outputs of inverters 104 and 106 form the inputs to data selector logic circuits 108, one of which is schematically illustrated in FIG. 11.

Each logic circuit 108 receives a different timing signal from a timing generator described below and illustrated in FIG. 14. The timing generator is the equivalent of counter 88 of FIG. 8 and the timing signals are the equivalent of the output thereof, $c_n$. These timing signals can be, for example, pulse trains having frequencies of 1 MHz, 500 KHz, 250 KHz, 125 KHz, 62.5 KHz, and 31.23 KHz, respectively.

Each logic circuit 108 receives one bit each of the DSM and DDSM signals at a time. The output of each logic circuit 108 (except the circuit receiving the 1 MHz timing signal) is inverted by an inverter 110 to form outputs $S_1 \ldots S_6$. The logic function of each logic circuit 108 and inverter 110 is as follows:

TABLE III

| Timing Pulse ($c_n$) | DSM | DDSM | Out |
|---|---|---|---|
| 0 | 0 | 0 | 0 |
| 0 | 1 | 0 | 0 |
| 0 | 0 | 1 | 1 |
| 0 | 1 | 1 | 1 |
| 1 | 0 | 0 | 0 |
| 1 | 1 | 0 | 1 |
| 1 | 0 | 1 | 0 |
| 1 | 1 | 1 | 1 |

As will be appreciated from the above table, the value of the timing pulse forms the output if DSM alone is high. The complement of the value of the timing pulse forms the output if DDSM is high. A "1" forms the output if both DSM and DDSM are high. A zero forms the output if both DSM and DDSM are low.

The parallel combination of the six logic circuits 108 with the timing pulse trains generate a logic result equivalent to that set forth in Table II, with the exception that the second line gives a logical output of $c_n$ instead of $c_{n+1}$. It is for this reason that the DSM signal itself forms a seventh output of the circuit of FIG. 10 to provide the additional required bit. The DSM output signal is re-named CIN and is the carry bit.

In conventional decimator structures, all of the bits of the parallel data word at the output of the ROM are applied to the accumulator at the delta-sigma input stream word rate. Such an accumulator design requires a very large chip area.

In the present invention, the accumulator is significantly simplified by using a pipelined approach to the accumulation process. The approach results in the unit cells running at the delta-sigma word rate with no requirement for the cells to propagate data through to other cells during each cycle. The pipelined approach also results in bits at the output of the accumulator arriving sequentially. Thus, a simple multiplexer can be employed to output the serial data words.

In order to pipeline the accumulator, the parallel input data word $S_1 \ldots S_6$ from the combinational logic of FIG. 10 is delayed bit by bit in a delay circuit, as shown in FIG. 12. As is clear from FIG. 12, the parallel outputs $S_1 \ldots S_6$ from FIG. 10 are each delayed by a number of bits which is a function of the position of the bit in the word. Thus, bit $S_1$ is delayed no bits, bit $S_2$ is delayed one bit, bit $S_3$ is delayed two bits, bit $S_4$ is delayed three bits, bit $S_5$ is delayed four bits, and bit $S_6$ is delayed five bits. The delay is achieved through the use of shift registers 112 of the required length. The carry bit output CIN is passed through the delay stage without delay. In the ROM implementation, there are no carry bits so that the CIN input of the accumulator would normally be left low. Outputs $OS_1 \ldots OS_6$ and CIN are fed to the multi-stage circuit shown on FIGS. 13A and 13B.

Figure 13B:
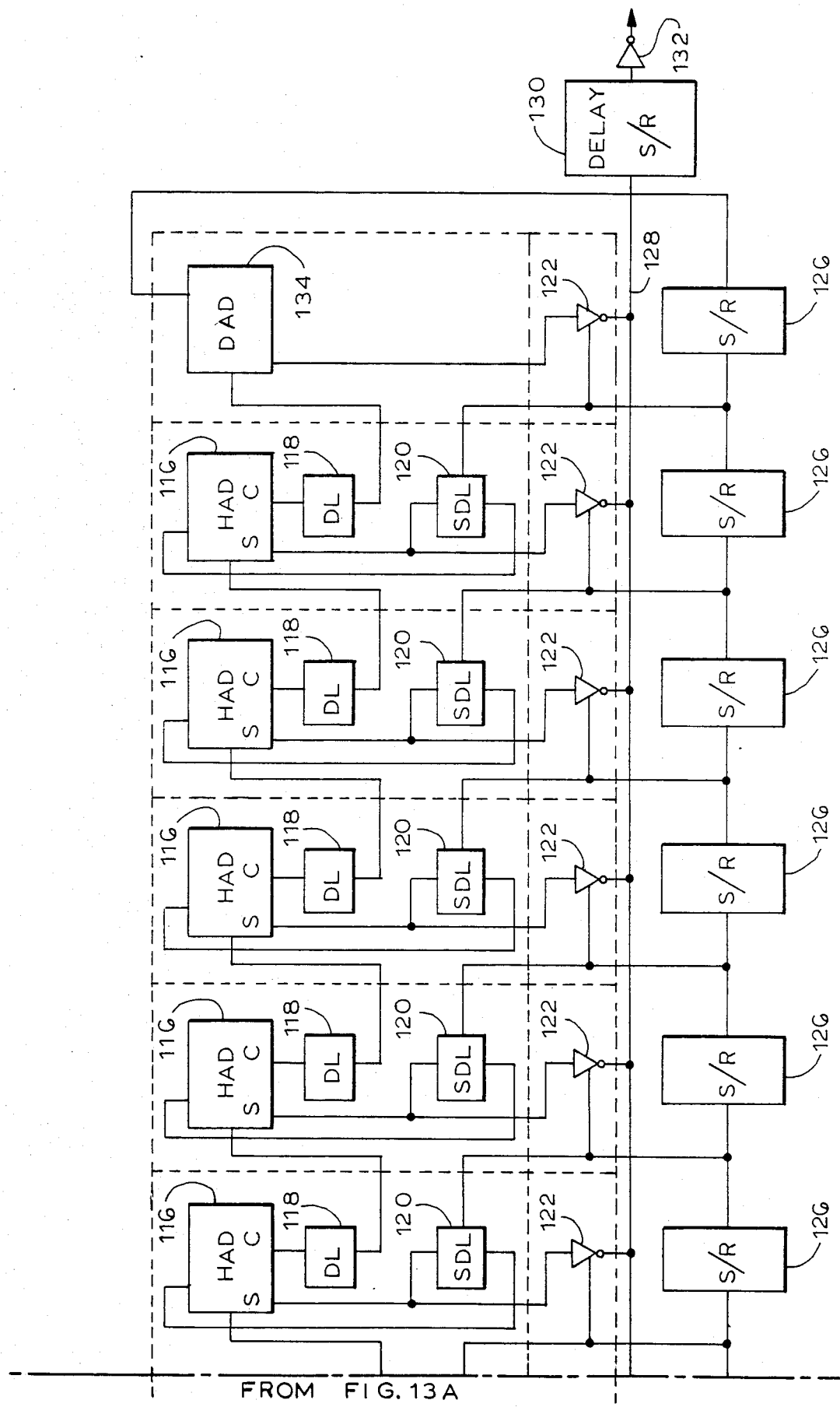

As shown in FIGS. 13A and 13B, the circuit has 12 stages, each stage including an adder, such as a full adder 114 (although half adders 116 may be used in the latter stages, if desired), a carry output delay logic cell 118, and a sum output delay logic cell 120, and an inverter logic cell 122, except for the last stage, the structure of which is discussed below.

Figure 17:
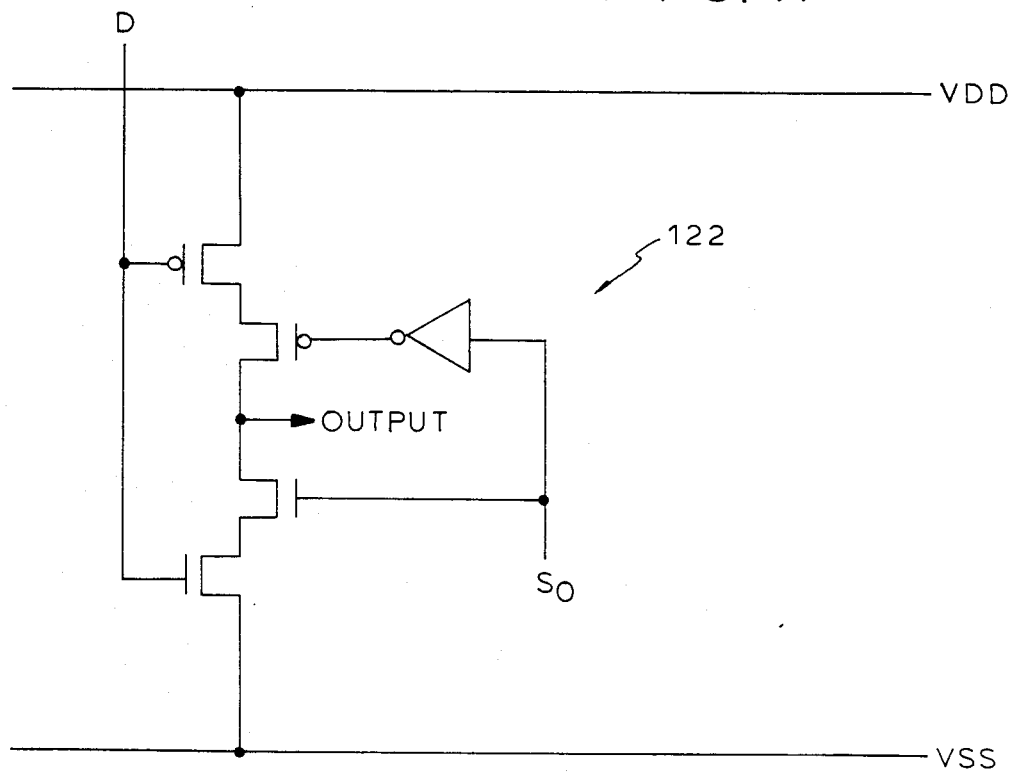
FIG. 17 is a schematic diagram of a typical inverter logic cell of the accumulator of the present invention.
Figure 20:
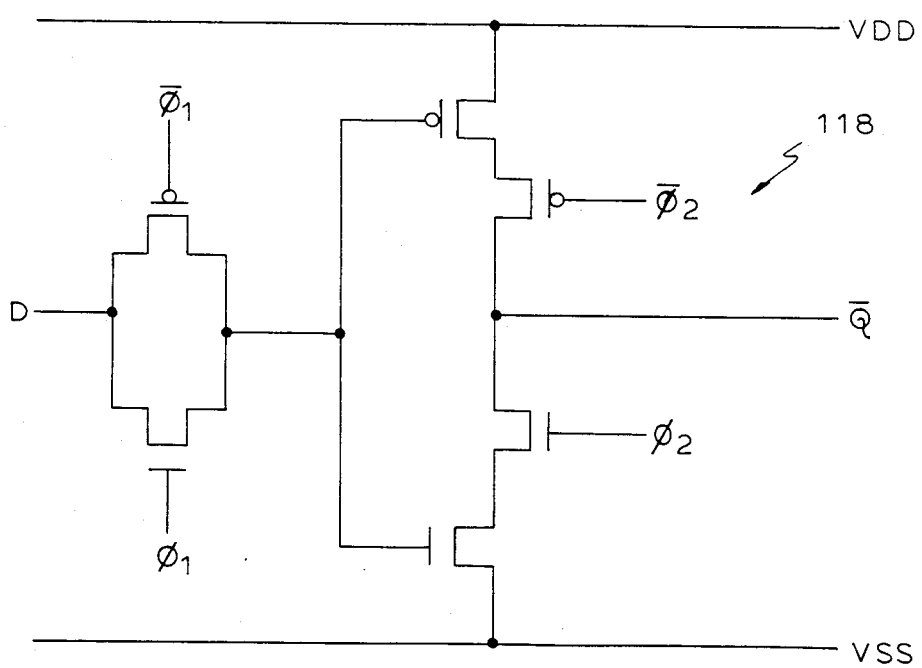
FIG. 20 is a schematic diagram of a typical DL cell of the accumulator of the present invention.
Figure 19:
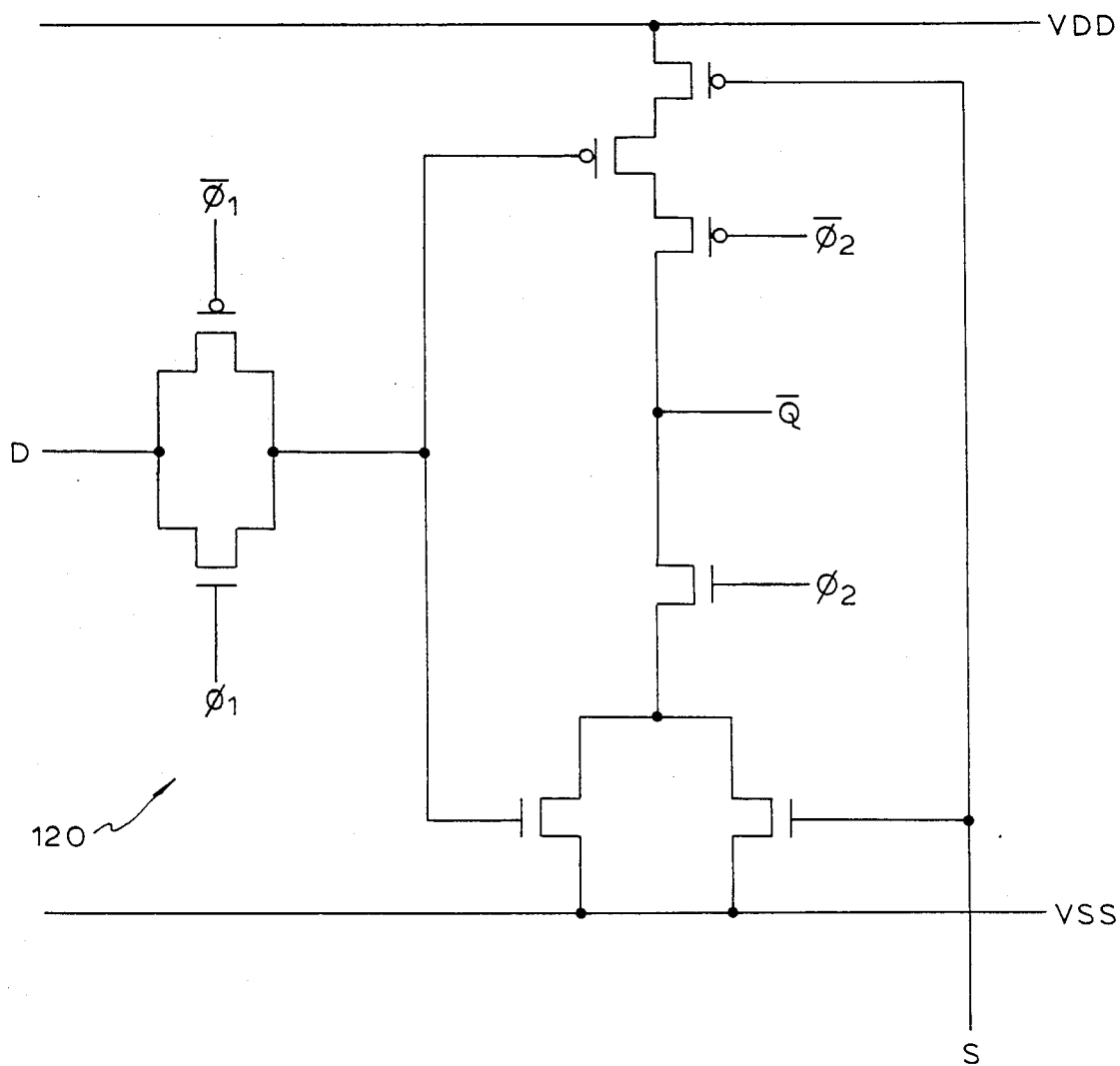
FIG. 19 is a schematic diagram of a typical SDL cell of the accumulator of the present invention.

The clock input to full adder 114 of the first stage receives the CIN signal. The clock inputs of the adder circuits in subsequent stages receive the output of the carry output delay logic circuit 118 of the previous stage. One data input of each of the full adders 114 in the first six stages receive, respectively, signals $OS_1 \ldots OS_6$ from the delay circuit of FIG. 12. In each stage, the second data input of the adder receives the output of the sum output delay logic circuit 120. The carry output of the adder in each stage is connected to the input of the carry output delay logic circuit 118. The sum output of the adder 114 is connected to the input of the sum delay logic circuit 120 and the input of the inverter logic cell 122, the structure of which is illustrated in FIG. 17. In the first stage, the data input to inverter logic cell 122 is a timing signal CLRIN from the timing signal generator (FIG. 14) which has been inverted by an inverter 124.

Figure 16:
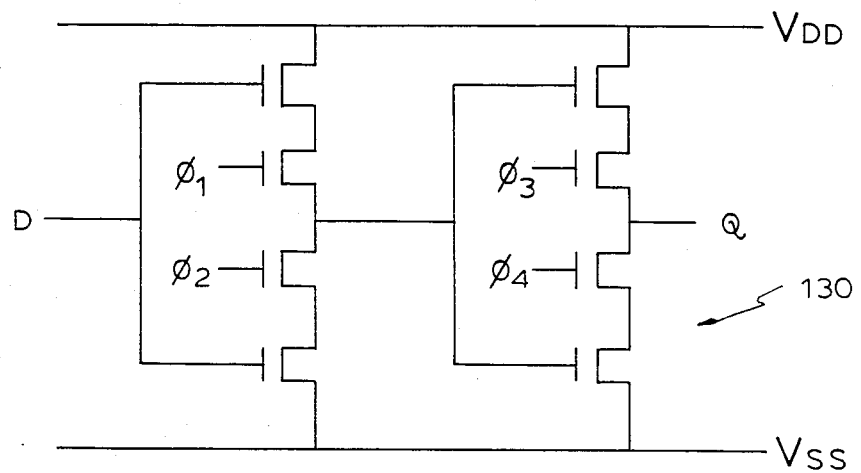
FIG. 16 is a schematic diagram of the delay shift register cell of the accumulator of the present invention.

A 12-bit multiplexer comprising shift register bits 126 is aligned with the accumulator such that one shift register bit 126 corresponds to each stage of the accumulator. In the second and subsequent stages of the accumulator, the input of the shift register 126 is connected to receive the output of the sum delay logic circuit 120 from the previous stage. The outputs of the various inverter logic cells 122 are connected to an output line 128 which, in turn, is connected to the input of a delay shift register 130 (illustrated schematically in FIG. 16). The output of shift register 130 is inverted by inverter 132.

The sum output is fed back to the input of the adder of each accumulator stage and the carry output is fed to the adder of the next stage. Thus, if a data word was presented at the inputs of the accumulator, then the sums produced would not align with the carries generated. If the input data word is delayed bit by bit, that is, the first bit (LSB) incurs no delay, the second bit, one delay, et cetera, as in the delay circuit of FIG. 12, then the carry output from the first accumulator stage is delayed one bit and realigns with the input data bit which has been delayed at the input of the accumulator. In this way, it is possible to pipeline the accumulation process.

Upon the last input data word, the sum of the least significant bit is produced after one bit delay and the sum of the second stage produced after two bits delay, and so on. A simple multiplexer is used to select the valid output sum onto a single data output line 128.

The only timing required is given by a single clock pulse CLRIN which clears the sum of the first stage at the end of the accumulation cycle. This pulse is simply delayed one bit to generate a clear pulse for the second stage of the accumulator, etc. It should be noted that the full adders are only necessary for the six least significant bits of the accumulator and half adders for the most significant bits (alternately, a counter could be used).

The output from the accumulator is an offset binary data word. To convert the data word into two's complement format, the sign bit (i.e., the most significant bit) has to be inverted. This is accomplished by the delayed pulse CLRIN presetting the most significant stage of the accumulator. Thus, the output of the last shift register stage 126 is connected to the preset input of a DAD cell 134 (FIG. 18) in the last stage of the accumulator. It should be noted that the last stage of the accumulator has no carry output delay logic circuit 118 or sum delay logic circuit 120. Note that shift register 130 is a delay shift register and the output of inverter 132 is the serial output of the accumulator.

Figure 14:
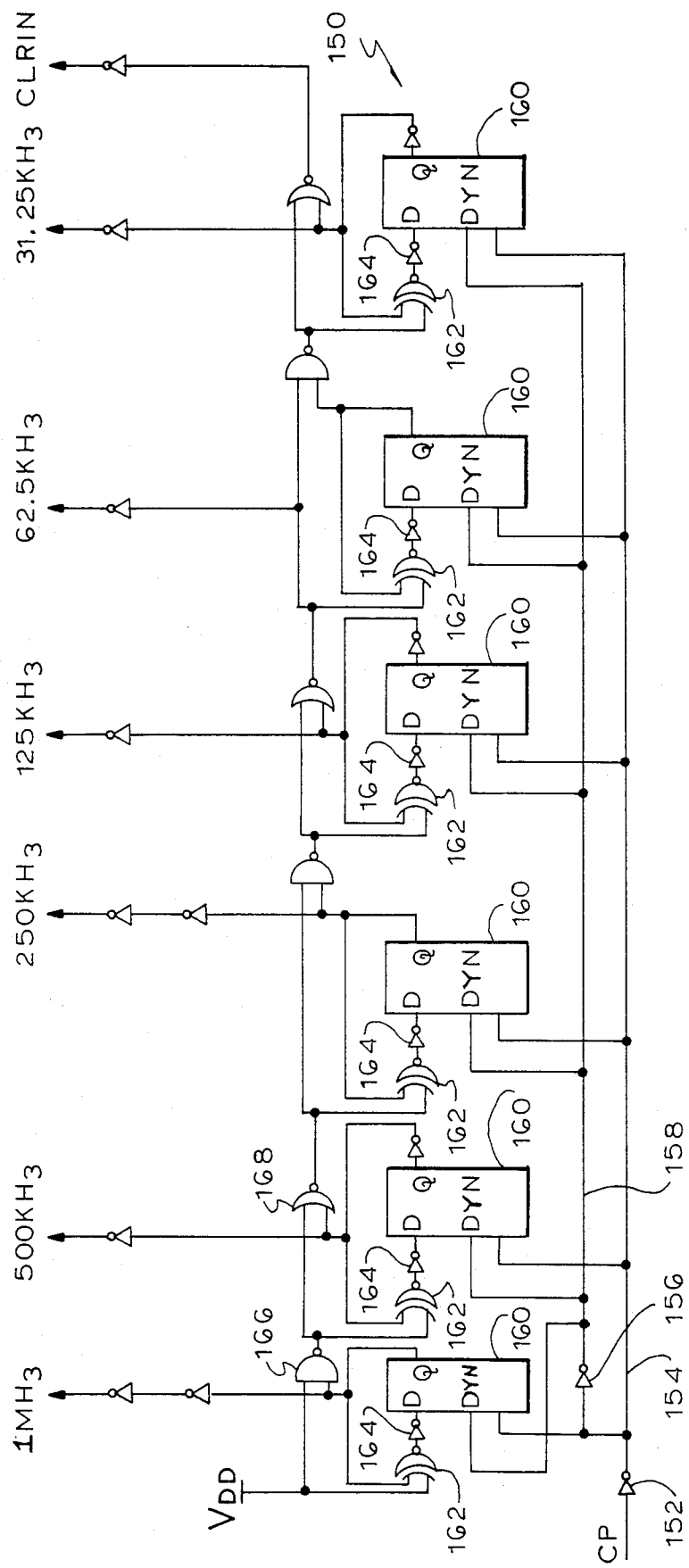
FIG. 14 is a schematic diagram of the timing signal generator of the present invention.

FIG. 14 illustrates the structure of a timing signal generator 150 which generates the various timing pulse trains utilized in the filter shown in FIG. 10 and the timing signal CLRIN used for clearing the shift register bits 126 of the multiplexer which forms a portion of the accumulator shown in FIGS. 13A and 13B. Timing generator 150 receives a master timing signal Cp (2 MHz) which is the output of a baud rate generator (not shown). The Cp signal is inverted by an inverter 152 and applied to bus 154. The output of inverter 152 is inverted in an inverter 156 and applied to a second bus 158.

Figure 15:
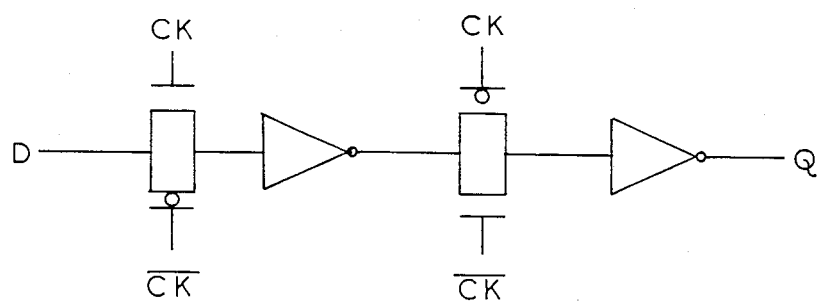
FIG. 15 is a schematic diagram of a typical DYN cell of the timing generator of the present invention.

The timing generator comprises a seven stage divider, each stage including a DYN cell 160, the structure of which is illustrated in FIG. 15. The CK and $\overline{CK}$ inputs to each cell 160 are connected to buses 158 and 154, respectively. The data input D of each DN cell 160 receives the output of an EX NORgate 162 through an inverter 164.

$V_{DD}$ forms the input to a NANDgate 166, the other input to gate 166 is the Q output of the DYN cell 160, upon which the 1 MHz output signal appears. The output of gate 166 forms one input to the EX NORgate 162 of the next stage. The output of gate 166 also is applied to one input of an EX ORgate 168, the other input of EX ORgate 168 is the Q output of the DYN cell 160 of the second stage upon which appears the 500 KHz signal. Each succeeding stage serves to divide the output of the prior stage in half. The CLRIN signal appears at the output of the next to the last stage.

It will now be appreciated that the present invention relates to an integrated analog-to-digital converter which can be formed on a semiconductor chip in a relatively small area and has reduced process sensitivity. The invention includes an integrated feedback coder which utilizes simple CMOS push/pull amplifiers in the gain stages so as to reduce the process sensitivity of the coder. A simplified finite impulse response filter employs a partial coefficient generator including a read only memory, counter and shift registers. The simplification occurs by observing that the data output of the FIR filter is not required at the input stream rate. A further simplification of the filter is employed for the special case of a triangular impulse response, such that the resulting PCM output stream is available at a rate equal to the PCM input stream rate divided by half of the number of taps of the windowing filter. The accumulator and shift register logic blocks of the filter are combined into a single block. In addition, by using a pipelined approach for the accumulator process, all stages of the accumulator run at the input word rate with no requirement for the stages to propagate data through more than one other stage during each cycle.

While only a limited number of preferred embodiments of the present invention have been disclosed herein for purposes of illustration, it is obvious that many variations and modifications could be made thereto. It is intended to cover all of these variations and modifications which fall within the scope of the present invention, as defined by the following claims:

We claim:

1. A feedback coder comprising summation means having first and second inputs and an output, said first input of said summation means receiving an analog signal to be coded, first filter means having an input operably connected to said output of said summation means, analog-to-digital conversion means having an input operably connected to said first filter means and an output, second filter means operably connected between said output of said analog-to-digital conversion means and said second input of said summation means, digital-to-analog conversion means operably connected between said output of said analog-to-digital conversion means and said second filter means, the output of said analog-to-digital conversion means forming the coder output, each of said filter means comprising CMOS push/pull amplification means.

2. The coder of claim 1, further comprising adaptive step size means operably connected to said digital-to-analog conversion means.

3. The coder of claim 1, wherein said analog-to-digital conversion means comprises comparator means and latch means.

4. The coder of claim 1, wherein said analog-to-digital conversion means comprises a bistable circuit.

5. The coder of claim 4, wherein said bistable circuit is a D-type flip-flop circuit.

6. The coder of claim 1, wherein said digital-to-analog conversion means comprises switch means.

7. A feedback coder comprising first and second summation means, each having first and second inputs and an output, said first input of said first summation means receiving an analog signal to be coded, first filter means operably connected between said output of said first summation means and said first input of said second summation means, second filter means, analog-to-digital conversion means, and digital-to-analog conversion means, said second filter means being operably connected between said output of said second summation means and said analog-to-digital conversion means, said analog-to-digital conversion means being operably connected between said second filter means and the input of said digital-to-analog conversion means, the output of said digital-to-analog conversion means being connected to said second input of each of said first and second summation means, the output of said analog-to-digital conversion means forming the coder output, each of said first and second filter means comprising CMOS push/pull amplification means.

8. The coder of claim 7, further comprising signal polarity inverting means operably connected between said digital-to-analog conversion means and said second summation means.

9. The coder of claim 7, wherein said first and second filter means each comprise first order low pass filters.

10. The coder of claim 7, wherein said first and second filter means each comprises single order integrators.

11. The coder of claim 7, wherein said analog-to-digital conversion means comprises comparator means and latch means.

12. The coder of claim 7, wherein said analog-to-digital conversion means comprises a bistable circuit.

13. The coder of claim 12, wherein said bistable circuit is a D-type flip-flop circuit.

14. A feedback coder comprising first and second summation means, each having first and second inputs and an output, first and second filter means, and bistable means, said first input of said first summation means being operably connected to receive the analog input to be coded, the input of said first filter means being operably connected to the output of said first summation means, said first input of said second summation means being operably connected to the output of said first filter means, the input of said second filter means being operably connected to the output of said second summation means, the input of said bistable means being operably connected to the output of said second filter means, said output of said bistable means being operably connected to said second input of said second summation means, said second input of said first summation means and the coder output, each of said filter means comprising CMOS push/pull amplification means.

15. The coder of claim 14, further comprising first inverter means operably connected between said output of said bistable means and said second input of said first summation means.

16. The coder of claim 15, further comprising second inverter means operably connected between said first inverter means and said coder output.

17. The coder of claim 16, further comprising third inverter means operably connected between said output of said bistable means and said second input of said second summation means.

18. The coder of claim 14, wherein said bistable means comprises a D-type flip-flop circuit.

19. The coder of any of claims 1, 7 or 14 for use with a decimator comprising finite impulse response filter means and sub-sampling means.

20. The coder of claim 19, wherein said finite impulse response filter means and subsampler means comprise partial coefficient generator means and accumulator means.

21. The coder of claim 20, wherein said partial coefficient generator means comprises memory means having address means and data output means, counter means and shift register means, the output of said coder, the output of said counter means, and the output of said shift register means being operably connected to said address means and said data output means being operably connected to said accumulator means.

22. The coder of claim 21, wherein said memory means is a read only memory.

23. The coder of claim 21, wherein said counter means comprises a multi-bit counter.

24. The coder of claim 21, wherein said shift register means comprises series connected shift registers, each having an output operably connected to said address means.

25. The coder of claim 20, further comprising means for generating a plurality of ordered timing pulse trains, each pulse train having a frequency which is a given fraction of the frequency of the prior timing signal in order and wherein said partial coefficient generator means comprises means for receiving said coder output, means for delaying said coder output, a plurality of selector logic means, each of said logic means receiving a different one of said pulse trains, said coder output and said delayed coder output and generating one bit of a parallel output word.

26. The coder of claim 25, wherein each of said logic means comprises means for forming an output to be at the same state as the state of the received pulse train, if the coder output is in a high state, to be the complement of the state of the received pulse train, if the delayed coder output is in a high state, to be a high state if both the coder output and the delayed coder output are in the high state, and to be a low state if both the coder output and the delayed coder output are in the low state.

27. The coder of claim 20, wherein said generator generates a parallel output word and wherein said accumulator means comprises means for delaying each bit of said output word by an interval which is a function of the position of the bit in said output word.

28. The coder of claim 27, wherein said accumulator comprises a plurality of stages and wherein the output of said delaying means is applied to the input of the first stage at the word rate of said coder output.

29. The coder of claim 28, wherein each of said stages comprises adder means having first and second data inputs, a clock input, a sum output and a carry output, said first data input of each of said adder means receiving a different bit from the output of said delaying means, means for operably connecting said second data input of each adder means with said sum output thereof and means for operably connecting said clock input to said carry output of the adder means of said preceding stage.

30. The coder of claim 29, wherein said means for connecting said second data input of each adder means to said sum output thereof comprises sum output delay means.

31. The coder of claim 29, wherein said means for connecting said clock input of each adder means to said carry output of said adder means of said preceding stage comprises carry output delay means.

32. The coder of claim 29, wherein said accumulator further comprises a multiplexer comprising said given number of shift register stages respectively corresponding with said stages, and connected in tandem, each of said shift register stages having an output, each of said outputs being operably connected to said sum output delay means of the corresponding stage.

33. The coder of claim 32, wherein said multiplexer further comprises means for inverting the output of the last shift register stage.

* * * * *